(12) United States Patent
Jiang et al.

(10) Patent No.: US 6,957,899 B2
(45) Date of Patent: Oct. 25, 2005

(54) LIGHT EMITTING DIODES FOR HIGH AC VOLTAGE OPERATION AND GENERAL LIGHTING

(75) Inventors: Hongxing Jiang, 2033 Plymouth Rd., Manhattan, KS (US) 66503; Jingyu Lin, 2033 Plymouth Rd., Manhattan, KS (US) 66503; Sixuan Jin, Manhattan, KS (US)

(73) Assignees: Hongxing Jiang, Manhatten, KS (US); Jingyu Lin, Manhatten, KS (US)

( * ) Notice: Subject to any disclaimer, the term of this patent is extended or adjusted under 35 U.S.C. 154(b) by 148 days.

(21) Appl. No.: 10/279,296

(22) Filed: Oct. 24, 2002

(65) Prior Publication Data
US 2004/0080941 A1 Apr. 29, 2004

(51) Int. Cl.$^7$ ................................ F21S 13/14
(52) U.S. Cl. ...................... 362/252; 362/800; 313/500; 315/193
(58) Field of Search .................. 362/252, 545, 362/800; 313/500; 257/88, 93; 315/185 R, 193; 428/195.1

(56) References Cited

U.S. PATENT DOCUMENTS

| | | | | |
|---|---|---|---|---|
| 5,278,432 A | * | 1/1994 | Ignatius et al. | 257/88 |
| 5,773,130 A | * | 6/1998 | So et al. | 428/195.1 |
| 6,461,019 B1 | * | 10/2002 | Allen | 362/249 |
| 2002/0043943 A1 | * | 4/2002 | Menzer et al. | 315/185 R |

* cited by examiner

Primary Examiner—Stephen F Husar
(74) Attorney, Agent, or Firm—Chase Law Firm, L.C.

(57) ABSTRACT

A single-chip integrated LED particularly adapted for direct use with a high voltage AC power comprises a plurality of series-connected LEDs arranged in two arrays. The opposite polarities of the arrays are connected together and then connected to the AC power source. During the positive half of the AC cycle, one array of LEDs is forward biased and energized, while the other array is reverse biased. During the negative half of the AC cycle, the other array of LEDs is forward biased and thus energized, while the first array is reverse biased and thus not energized. The arrays are alternately energized and de-energized at the frequency of the AC power source, and thus the single-chip integrated LED always appears to be energized.

32 Claims, 2 Drawing Sheets

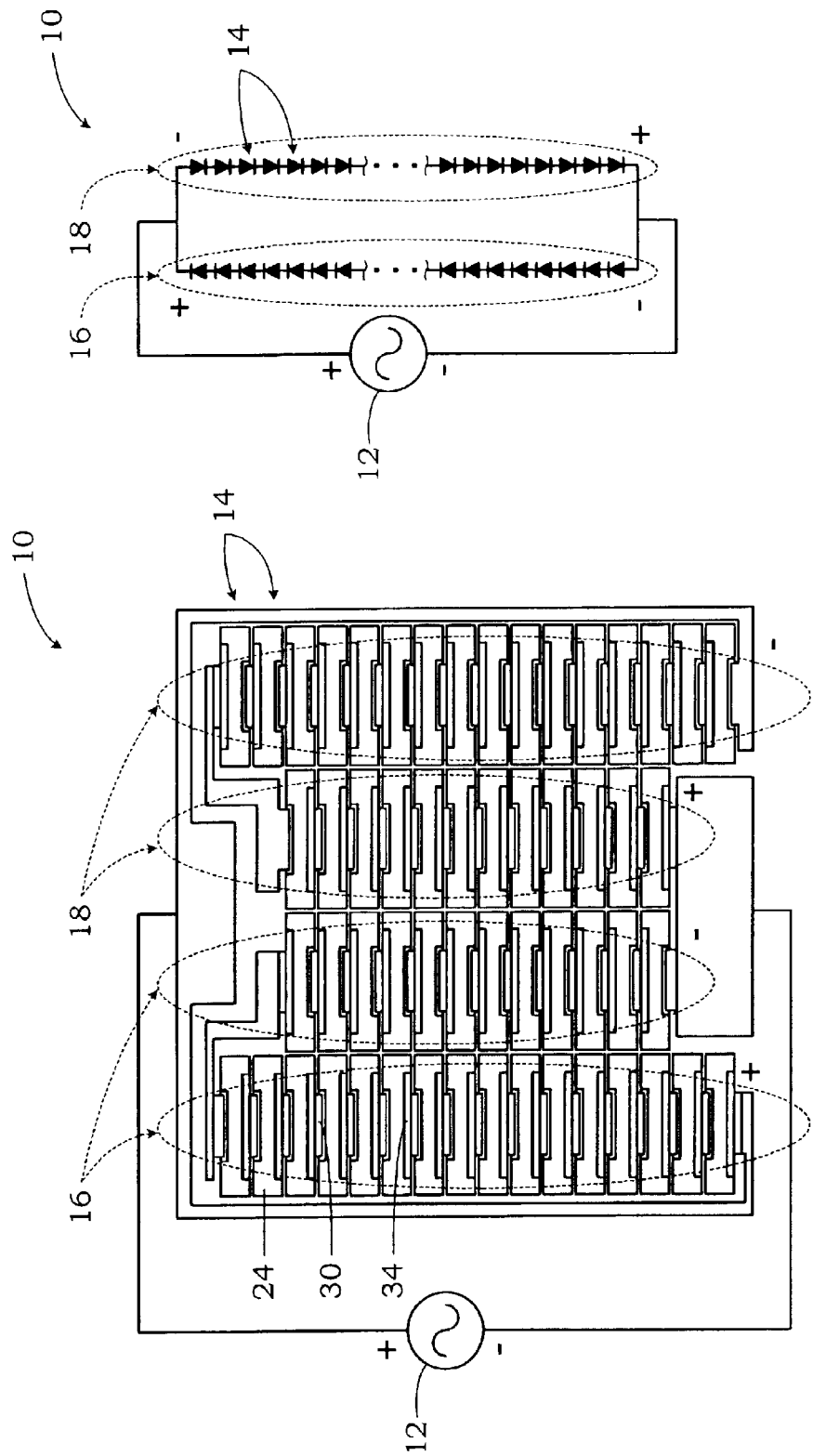

LIGHT EMITTING DIODES FOR HIGH AC VOLTAGE OPERATION AND GENERAL LIGHTING

BACKGROUND OF THE INVENTION

The present invention relates to single-chip light emitting diodes (LED), and more particularly to single-chip LEDs which can operate under standard alternating-current (AC) high voltage (110 V, 220 V, etc.) conditions for various applications, including general lighting.

LEDs are used in displays, as indicator lights, for traffic lights, for communications, and for optical interconnects. With the realization of high brightness blue/green and violet LEDs made from the III-nitride semiconductor family InN, GaN, AlN and their alloys recently it is now possible that LEDs may be used for general lighting applications in residential houses and commercial buildings. LEDs have already found niche applications in the area of lighting, such as passenger side reading lights in vehicles. Because of the potential energy, environment and national security benefits, there is increasing national interest in creating a partnership—of industry, universities and national laboratories—aimed at accelerating the development of Solid-State Lighting science and technology. A nation-wide program called "Next-Generation Lighting Initiative" has been lunched by the Department of Energy (DOE).

Several methods have been proposed and employed to achieve white light emission from LEDs. The first and the only commercial product is to use blue LEDs made of III-nitrides to generate white light by coating the blue LED chips with yellow phosphors. Phosphors down convert part of the shorter wavelength blue light to a yellow wavelength visible yellow light. Through color mixing, the eye sees white when two colors are properly balanced. Other proposed method includes using UV LEDs (more efficient sources) to pump three-color phosphors (red, blue, green, RBG) or to combine three color (RBG) LEDs to get white emission.

Currently, all semiconductor LEDs are DC operated with typical operating voltages of a few volts (e.g., around 2 volts for Red LEDs and around 3.5 volts for blue LEDs). However, substantially all the houses and buildings in North America are wired with AC (60 Hz) 110 volts power sources. One way to use LEDs for general lighting applications is to convert AC 110 V to DC with a low voltage. This requires the use of power converters, which may be installed separately or built into the LED package. This approach has been utilized in LED traffic signal lights. Use of power converters have disadvantages such as added volume, added costs, and low efficiency, for example.

There is also a method for achieving AC operation of LEDs by wiring two discrete LEDs connected opposite of one another (the cathode of one goes to the anode of the other). When the LEDs are connected to a low voltage AC circuit, both LEDs glow alternately; one LED is biased by positive voltage side of the AC cycle (forward biased), and the other LED is biased by the negative voltage side of the AC cycle (reverse biased). Since the AC source usually runs at 60 Hz both LEDs appear to be always on to the naked eye. However, there are no new technologies involved in this type of "AC-LEDs" by ganging together a strand of LEDs and they are not suitable for lighting applications. To achieve high voltage AC operations, one needs to connect a few dozens of LEDs in a similar fashion. Hence it would not be viable economically or physically to replace an incandescent lamp by a strand of discrete of LEDs.

A need remains in the art for single-chip LEDs for standard high AC voltage (110 volts or 220 volts) operations. A need also remains in the art for integrated semiconductors optical components on a single chip; in this case it involves the integration of many LEDs.

SUMMARY OF THE INVENTION

The present invention provides single-chip LEDs through the use of integrated circuit technology, which can be used for standard high AC voltage (110 volts for North America, and 220 volts for Europe, Asia, etc.) operation. The single-chip AC LED integrates many smaller LEDs, which are connected in series. The integration is done during the LED fabrication process and the final product is a single-chip device that can be plugged directly into house or building power outlets or directly screwed into incandescent lamp sockets that are powered by standard high AC voltages. The series connected smaller LEDs are patterned by photolithography, etching (such as plasma dry etching), and metallization on a single chip. The electrical insulation between small LEDs within a single-chip is achieved by etching light emitting materials into the insulating substrate so that no light emitting material is present between small LEDs. The voltage crossing each one of the small LEDs is about the same as that in a conventional DC operating LED fabricated from the same type of material (e.g., about 3.5 volts for blue LEDs). To account for the difference between the AC and DC current, two columns of series-connected mini-LEDs are wired in opposite polarities. At one instant, all the mini-LEDs in one of the columns are forward biased and hence are all turned-on, while the mini-LEDs in the other column are all reverse biased and hence are all turned off. However, the AC current turns on and off these two columns alternately. Since the frequency of AC power supply is 60 Hz (or 50 Hz) all these small LEDs within the single-chip appear to be on all the time to the naked eye.

BRIEF DESCRIPTION OF THE DRAWINGS

FIG. 1 is a diagrammatic plan view of a single-chip high voltage AC LED of the present invention.

FIG. 2 is an equivalent circuit of the single-chip high voltage AC LED of FIG. 1.

DETAILED DESCRIPTION OF THE PREFERRED EMBODIMENT

Figure 3:
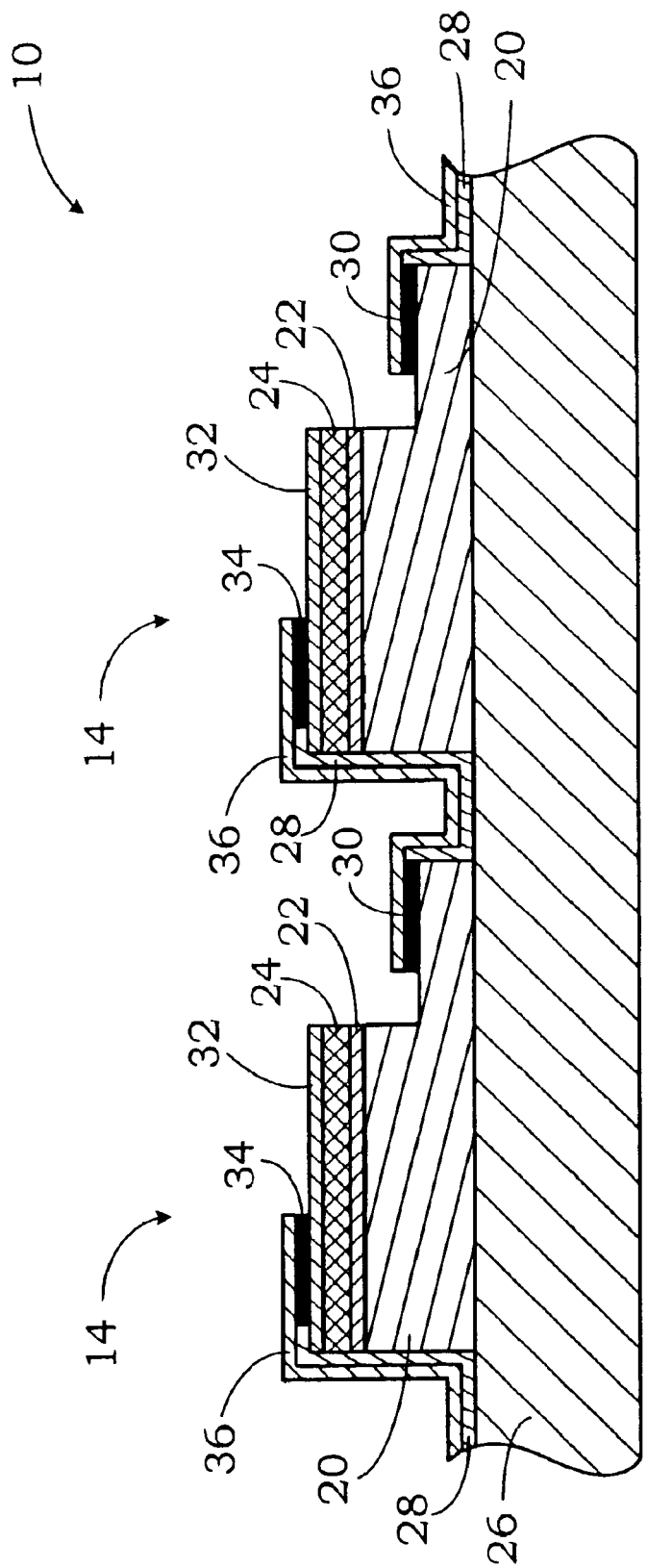
FIG. 3 is a diagrammatic cross sectional illustration showing integration between adjacent LED elements within the single-chip high voltage AC LED.

Referring to FIG. 1, a single-chip high voltage AC LED 10 is illustrated connected to a high voltage AC power supply 12. As shown, the single-chip high voltage AC LED 10 effectively consists of two arrays of series-connected individual smaller LEDs 14. The two arrays of series-connected individual LEDs are then connected to the opposite polarities of the high voltage AC power source 12. Each LED array could be made into one or many columns to fit the desired geometrical shape of the single-chip high voltage LED. In FIG. 1, each array consists of two columns for illustration.

Referring to FIGS. 1 and 2, the first array 16 of the single-chip AC LED 10 provides a number of series-connected smaller LEDs 14. The cathode of one LED 14 is connected to the anode of the next LED to form the array 16. The array 16 of LEDs 14 presents a positive terminal corresponding to the cathode of the last LED (shown at the bottom of the first column of array 16 in FIG. 1 and shown at the top of array 16 in FIG. 2), and a negative terminal corresponding to the anode of the first LED (shown at the bottom of the second column of array 16 in FIG. 1 and shown at the bottom of the array 16 in FIG. 2). The second array 18 of the single-chip AC LED 10 provides an equal number of series-connected smaller LEDs 14. The cathode of one LED 14 is connected to the anode of the next LED to form the array 18. The array 18 of LEDs 14 also presents positive and negative terminals, which are connected to the opposite terminal of array 16. When the AC cycle is positive, the LEDs 14 of array 16 are forward biased and thus energized. At the same time, the LEDs 14 of array 18 are reverse biased, and hence turned off. When the AC cycle is negative, the LEDs 14 of array 16 are reverse biased and hence turned off, while the LEDs 14 of array 18 are forward biased and thus turned on.

The arrays 16 and 18 are connected to different polarities of the AC power source for high voltage AC operation. The arrays 16 and 18 of smaller LEDs 14 are alternatively turned on and off at a rate corresponding to the frequency of the AC source. Common frequencies for public utilities are 60 Hz or 50 Hz, for example. Thus for a 60 Hz AC power source, arrays 16 and 18 are alternatively energized at a 60 Hz rate. In this manner, to the naked eye, the single-chip high voltage AC LED 10 always appears to be on.

The number of series-connected smaller LEDs 14 in each array 16 and 18 depends on the operating voltage of the individual LEDs 14. The operating voltage of an LED depends on the type of the LED, which is around 2 volts for red LED and around 3.5 volts for blue LEDs. The typical variation in the operating voltage among individual smaller LEDs may be approximately 0.1–0.3 V depending on the type and manufacturer of the LED. For example, using LEDs having a typical operating voltage of 4.0 volts, the number of the LEDs "n" in each array 16 and 18 is approximately 28 for a 110 volt AC power source 12.

For a 220 volt AC application, as is commonly used in European and Asian countries, for example, approximately 55 LEDs would be integrated into each array. Thus, the number of LEDs is dependent on the voltage characteristics of the LEDs used or formed on the single-chip, and the application voltage of 110 volts AC or 220 volts AC. For a forward voltage of 3.5 volts for an individual LED 14, for example, the number of LEDs "n" in each column 16 and 18 is approximately 31 for a 110 volt AC power source. The number of LEDs is dependent on the voltage characteristics of the type of LED used. For example, the forward voltage for a red LED may be approximately 2 volts and 3 to 4 volts for a blue LED. If the AC voltage is 220 volts, the number of LEDs in the columns 16 and 18 will be approximately double that of the 110 volt application.

Referring to FIG. 3, a diagrammatic cross-sectional view of the single-chip AC high voltage LED 10 is illustrated showing the details of integration and connection of two adjacent smaller LEDs 14. The single-chip AC LED 10 is formed by depositing layers of n-type semiconductor material 20, optically active layers 22 and p-type semiconductor material 24 in succession on an insulating substrate 26. In FIG. 3, n-type gallium nitride (n-GaN) 20, indium gallium nitride/gallium nitride multiple quantum wells (InGaN/GaN MQW) optically active layers 22 and p-type gallium nitride (p-GaN) 24 in succession on a sapphire substrate 26 are being used as an illustration. Substrate 26 may be made of an insulating material as shown in FIG. 3 or may be a layer of insulating film deposited on a conducting substrate or other material.

The electrical insulation between the two adjacent LEDs 14 is accomplished by etching (dry or wet chemical etching) into the insulating substrate 26 so that no light emitting material is present between the two LEDs 14. An insulating film 28 such as silicone dioxide ($SiO_2$) is subsequently deposited on the etched surface 26. An n-type ohmic contact 30 is deposited on the exposed n-type layer 20. A transparent p-type metal film 32 is deposited on the p-type layer 24 upon which a p-type ohmic contact 34 is deposited. A conductive layer 36 connects the n-type ohmic contact 30 of one LED 14 to the p-type ohmic contact 34 of the next LED 14.

It should be understood that p-n junction, heterojunction, multiple quantum well, organic electro-luminescent and polymer electro-luminescent LEDs as well as other types light emitting diodes may be configured as described hereinabove or in other combinations. Additionally, LEDs may be configured for 110-volt operation and 220-volt operation using switches. When configured for 110-volt operation, the arrays 16 and 18 may be connected as described hereinabove. Using a pair of switches, the 110-volt configuration may be converted to 220-volt operation wherein both arrays are series-connected and forward biased simultaneously. In this way, all of the LEDs are energized or on for half of the AC cycle and all of them are off for the other half of the AC cycle.

It should be understood that while a certain form of this invention has been illustrated and described, it is not limited thereto except insofar as such limitations are included in the following claims.

What is claimed is:

1. A single-chip integrated LED for use with a high voltage AC power source comprising:
a first plurality of series connected LEDs having a forward biased direction of current flow, a reverse biased direction of no current flow opposite said forward biased direction of current flow, and presenting positive and negative terminals,
a second plurality of series connected LEDs having a forward biased direction of current flow, a reverse biased direction of no current flow opposite said forward biased direction of current flow, and presenting positive and negative terminals,
said positive terminal of said first plurality of LEDs connected to said negative terminal of said second plurality of LEDs,
said negative terminal of said first plurality of LEDs connected to said positive terminal of said second plurality of LEDs, and
said terminals of said first and second plurality of LEDs connected to the opposite polarities of said AC power source,
whereby a current from said AC power source energizes said first plurality of LEDs in the forward biased direction during a first half cycle of the AC power source and said current from said AC power source energizes said second plurality of LEDs in the forward biased direction during a second half cycle of the AC power source.

2. The single-chip integrated LED as claimed in claim 1 wherein said AC power source is 110 volts.

3. The single-chip integrated LED as claimed in claim 1 wherein said AC power source is 220 volts.

4. The single-chip integrated LED as claimed in claim 1 wherein said chip is fabricated on an insulating substrate material.

5. The single-chip integrated LED as claimed in claim 1 wherein said plurality of LEDs include semiconductor p-n junctions.

6. The single-chip integrated LED as claimed in claim 1 wherein said plurality of LEDs include semiconductor heterojunctions.

7. The single-chip integrated LED as claimed in claim 1 wherein said plurality of LEDs include semiconductor quantum wells.

8. The single-chip integrated LED as claimed in claim 1 wherein said plurality of LEDs include organic electroluminescent materials.

9. The single-chip integrated LED as claimed in claim 1 wherein said plurality of LEDs include polymer electroluminescent materials.

10. A single-chip integrated diode for use with a high voltage AC power source comprising:
   a first plurality of diodes having a forward biased direction of current flow, a reverse biased direction of no current flow opposite said forward biased direction of current flow, and presenting positive and negative terminals,
   a second plurality of diodes having a forward biased direction of current flow, a reverse biased direction of no current flow opposite said forward biased direction of current flow, and presenting positive and negative terminals,
   said first and second plurality of diodes connected together such that said respective forward biased directions of current flow are opposing, and
   said first and second plurality of diodes connected to the opposing polarities of said AC power source,
   whereby said first and second plurality of diodes are alternatively energized by said AC power source.

11. The single-chip integrated diode as claimed in claim 10 wherein said diode is a light emitting diode.

12. The single-chip integrated diode as claimed in claim 10 wherein said AC power source is 110 volts.

13. The single-chip integrated diode as claimed in claim 10 wherein said AC power source is 220 volts.

14. The single-chip integrated diode as claimed in claim 10 wherein said chip is fabricated on an insulating substrate material.

15. The single-chip integrated diode as claimed in claim 10 wherein said plurality of diodes include semiconductor p-n junctions.

16. The single-chip integrated diode as claimed in claim 10 wherein said plurality of diodes include semiconductor heterojunctions.

17. The single-chip integrated diode as claimed in claim 10 wherein said plurality of diodes include semiconductor quantum wells.

18. The single-chip integrated diode as claimed in claim 10 wherein said plurality of diodes include organic electroluminescent materials.

19. The single-chip integrated diode as claimed in claim 10 wherein said plurality of diodes include polymer electroluminescent materials.

20. The single-chip integrated diode as claimed in claim 10 wherein said plurality of diodes include IR or UV diodes.

21. A single-chip integrated diode for use with a high voltage AC power source comprising:
   an array of series-connected diodes having a forward biased direction of current flow, a reverse biased direction of no current flow opposite said forward biased direction of current flow, and presenting positive and negative terminals, and
   said terminals of said array connected to opposite polarities of said AC power source,
   whereby a current from said AC power source energizes said array in the forward biased direction of said array during a first half cycle of the AC power source cycle.

22. The single-chip integrated diode as claimed in claim 21 further comprising:
   a second array of series-connected diodes having a forward biased direction of current flow, a reverse biased direction of no current flow opposite said forward biased direction of current flow, and presenting positive and negative terminals,
   said positive terminal of said second array connected to said negative terminal of said array, and
   said negative terminal of said second array connected to said positive terminal of said array,
   whereby said current from said AC power source energizes said second array in the forward biased direction of said second array during a second half cycle of the AC power source cycle.

23. The single-chip integrated diode as claimed in claim 21 wherein said diode is a light emitting diode.

24. The single-chip integrated diode as claimed in claim 21 wherein said AC power source is 110 volts.

25. The single-chip integrated diode as claimed in claim 21 wherein said AC power source is 220 volts.

26. The single-chip integrated diode as claimed in claim 21 wherein said chip is fabricated on an insulating substrate material.

27. The single-chip integrated diode as claimed in claim 21 wherein said plurality of diodes include semiconductor p-n junctions.

28. The single-chip integrated diode as claimed in claim 21 wherein said plurality of diodes include semiconductor heterojunctions.

29. The single-chip integrated diode as claimed in claim 21 wherein said plurality of diodes include semiconductor quantum wells.

30. The single-chip integrated diode as claimed in claim 21 wherein said plurality of diodes include organic electroluminescent materials.

31. The single-chip integrated diode as claimed in claim 21 wherein said plurality of diodes include polymer electroluminescent materials.

32. The single-chip integrated diode as claimed in claim 21 wherein said plurality of diodes include IR or UV diodes.

* * * * *